United States Patent [19]

Cull et al.

[11] Patent Number: 4,574,160
[45] Date of Patent: Mar. 4, 1986

[54] FLEXIBLE, ROLLABLE PHOTOVOLTAIC CELL MODULE

[75] Inventors: Ronald C. Cull, Milan; Robert A. Hartman; Paul E. Koch, both of Chagrin Falls, all of Ohio

[73] Assignee: The Standard Oil Company, Cleveland, Ohio

[21] Appl. No.: 656,175

[22] Filed: Sep. 28, 1984

[51] Int. Cl.[4] ............................................. H01L 25/02
[52] U.S. Cl. .................................... 136/245; 136/244; 136/249; 136/251; 136/258; 357/68
[58] Field of Search ....... 136/244, 245, 251, 258 AM, 136/249 MS; 357/68

[56] References Cited

U.S. PATENT DOCUMENTS

| | | | |
|---|---|---|---|
| 3,150,999 | 9/1964 | Rudenberg et al. | 136/256 |
| 3,375,141 | 3/1968 | Julius | 136/244 |
| 3,457,427 | 7/1969 | Tarneja et al. | 250/239 |
| 3,459,391 | 8/1969 | Haynos | 244/1 |
| 3,575,721 | 4/1971 | Mann | 136/244 |
| 4,287,382 | 9/1981 | French | 136/244 |
| 4,292,092 | 9/1981 | Hanak | 148/1.5 |
| 4,301,322 | 11/1981 | Amick | 136/256 |
| 4,336,648 | 6/1982 | Pschunder et al. | 29/572 |
| 4,348,546 | 9/1982 | Little | 136/256 |
| 4,409,605 | 10/1983 | Ovshinsky et al. | 357/2 |
| 4,419,530 | 12/1983 | Nath | 136/251 |
| 4,443,652 | 4/1984 | Izu et al. | 136/251 |

OTHER PUBLICATIONS

*Solar Cell Array Design Handbook*, Chapter 5, Jet Propulsion Laboratory, California Institute of Technology, Pasadena, California, Oct. 1976.

Primary Examiner—Aaron Weisstuch
Attorney, Agent, or Firm—Larry W. Evans; Jeffrey A. Wyand; Thomas P. Schur

[57] ABSTRACT

A photovoltaic array module incorporating a plurality of photovoltaic cell strips (11). Each cell strip (11) incorporates an electrically conductive substrate layer (22), a semiconductor body (23) deposited on the substrate layer (22), and a transparent electrically conductive layer (24) deposited on the semiconductor body (23). Electrically conductive filaments (20) are alternately connected to contact points (31) on the electrically conductive substrate layer (22) of one cell strip (11) and to contact points (32) on the transparent electrically conductive layer (24) of another cell strip (11). A first busbar (12) and a second busbar (13) are connected to the end cell strips (11) of the array to collect the electrical energy generated thereby.

26 Claims, 11 Drawing Figures

FLEXIBLE, ROLLABLE PHOTOVOLTAIC CELL MODULE

TECHNICAL FIELD

The present invention relates generally to a photovoltaic cell module. More particularly, the present invention relates to a large area photovoltaic cell module encompassing a plurality of individual photovoltaic cell strips. Specifically, the present invention pertains to electrical interconnections between the individual cell strips that are resistant to mechanical and thermal stresses experienced by the cell module. To elaborate on this aspect, the present invention relates to a photovoltaic cell module having individual photovoltaic cell strips which are electrically interconnected to each other through a network of fine wire filaments such that a series connection is attained between successive cell strips. The present invention further relates to a photovoltaic array roll incorporating the foregoing module.

BACKGROUND ART

Because of the increasing costs of exploration, processing and use of conventional fuels, such as coal, oil and gas, developments have been made to utilize alternative energy sources. One of these alternative energy sources which has been the subject of considerable interest is solar energy. Particularly, vast developments have been made in harnessing and converting solar energy into usable electrical energy.

As a result of the developments made in harnessing solar energy, three primary types of photovoltaic devices have come into being: crystalline solar cells, semicrystalline solar cells, and amorphous solar cells. Each of these solar cell types produces electricity as a result of what is commonly known in the solar cell field as the photovoltaic effect. This is an inherent feature of a semiconductor region in the photovoltaic device which, in the case of amorphous silicon cells, generally comprises adjacent, layered regions of P-type doped amorphous silicon and N-type doped amorphous silicon which define a PN junction, or P-type doped amorphous silicon, intrinsic (I-type) amorphous silicon, and N-type doped amorphous silicon which define a PIN junction. Upon exposure to solar radiation, an electric field is generated across this junction as electrons and holes move thereacross, thereby generating electrical current. For a more detailed discussion regarding the physical structure and electrical characteristics of amorphous solar cells, reference may be made to U.S. Pat. No. 4,409,605 to Ovshinsky et al.

An inherent problem with any type of solar cell involves the collection of electrical energy from the solar cell itself. Particularly, the electrical connection to the surface exposed to solar radiation is of major concern. This is so because any electrical collector means must ideally exhibit good electrical conductivity with high solar radiation transparency. Unfortunately, these two parameters are not found in any one material which is economical to solar cell production. As such it has been necessary to employ at least two distinct electrical conductor means to collect the electrical energy from the solar cell.

One arrangement normally employed in amorphous solar cell design involves a transparent conductive oxide (TCO) layer, such as indium tin oxide or indium oxide, layered over the top layer—either P or N type—of the semiconductor region of the solar cell. The TCO layer permits the influx of solar radiation into the semiconductor region while providing an electrical path therefrom. However, the electrical resistivity of the TCO layer is relatively substantially great and, therefore, restricts electrical current flow over large surface distances. To remedy this problem, it is necessary to provide electrical conductors of lower electrical resistance adjacent to, and electrically communicating with, the TCO layer to receive the electrical current therefrom. Suitable electrical conductors of this type are generally silver ink grids screen-printed onto the TCO surface. However, these grids are limited in size because of their current carrying capacity and the shadowing effect they have on the solar cell, inasmuch as these grids are generally opaque. As such, the overall efficiency of a solar cell declines as the surface area of the grid increases.

One solution to this size limitation problem is to employ several relatively small solar cells electrically joined together in series and in parallel through a network of interconnections to form solar modules and/or arrays. These are capable of providing a variety of voltage and current outputs as a result of the particular electrical interconnections. Another advantage of these solar assemblies is that should any of the individual solar cells fail to produce electrical energy, the entire electrical output of the assembly will only be slightly diminished and generally will remain functional.

The use of multi-celled solar modules, however, is not without inherent problems. Particularly, the interconnections between solar cells are generally relatively small and, as such, are highly susceptible to mechanical and thermal stresses experienced by the solar module. Indeed, the normal handling of the solar module during fabrication, installation, and maintenance may easily damage the electrical connection network. Moreover, the cyclic temperature change which the solar module experiences, as it is exposed to periods of sunlight and periods of darkness, causes thermally induced stresses in the electrical interconnections which ultimately result in fatigue failures thereof.

Efforts to remedy these stress problems have resulted in the general acceptance of electrical interconnections of substantial size which are more resistant to the stress loadings. However, the larger size of the interconnections causes increased shadowing of the solar cells in those areas where they overlay, thereby detrimentally reducing the output of electrical energy from the solar cell. To avoid such optical obscuration losses caused by the shadowing effect on the solar cell, the electrical interconnections in amorphous silicon solar cells, at least, have been joined to the peripheral edge of the TCO layer. However, this, too, causes detrimental reduction in the electrical output of the solar cell as current received by the TCO layer at the distal extreme end from the interconnection junction is required to travel the full width of the solar cell through the poorly conductive TCO layer.

Another problem experienced in these electrical interconnections is the lack of flexibility thereof. Particularly with the development of amorphous solar cells on thin metal substrates, which are substantially more flexible than the crystalline solar cells, the rigidity of the electrical interconnection has been a limiting factor in developing new applications for solar arrays. The desirable characteristic of the solar array of assuming the shape of currently existing support surfaces, an attribute of amorphous solar cells, is substantially precluded because of the inflexible electrical interconnections.

Exemplary of the existing technology pertaining to this aspect of the art are U.S. Pat. Nos. 4,410,558 to Izu et al, and 4,419,530 to Nath. Particularly, Izu et al discloses a system for producing amorphous solar cells in continuous strip form on thin metal substrates. Such a system provides economical solar cell material which may then be employed in solar cell modules and arrays. Nath discloses a method for interconnecting a plurality of solar cells to form a large area solar cell panel. The interconnect system disclosed permits individual solar cells to be selectively electrically isolated from the solar cell panel, as when, for example, an individual solar cell is determined to be defective. While these disclosures constitute advantageous contributions to the art of solar cells, they do not resolve the above-discussed problems.

In addition to the foregoing problems, the process of locating and securing the electrical interconnections relative to each individual solar cell in the array requires substantial man-hours during assembly. This time consuming process results in labor costs which account for a major portion of the overall cost of the solar array. Indeed, the exceedingly high cost of solar arrays has been a considerable hindrance in the development and commercialization of photovoltaic devices.

Despite the substantial work and research directed to development of photovoltaic devices, no photovoltaic cell module or array embodies the desirable attributes currently sought. Namely, no photovoltaic module provides individual solar cells electrically joined together by highly conductive electrical interconnections which are resistant to normally experienced mechanical and thermal stresses. Furthermore, none offers electrical interconnections which avoid shadowing of the solar cell while at the same time providing flexibility at the junctions between individual solar cells.

DISCLOSURE OF THE INVENTION

In general, a photovoltaic array module according to the concept of the present invention includes a busbar and a plurality of individual photovoltaic cell strips. Each cell strip has an electrically conductive substrate layer, a semiconductor body deposited on the substrate layer, and a transparent electrically conductive layer deposited on the semiconductor body. An electrically conductive filament is alternately connected to the electrically conductive substrate layer of one photovoltaic cell strip and to the transparent electrically conductive layer of another photovoltaic cell strip. Means are also provided for connecting the transparent electrically conductive layer of the one photovoltaic cell strip to the busbar.

Preferred and alternative embodiments of a photovoltaic array module incorporating the concept of the present invention are shown by way of example in the accompanying drawings without attempting to show all the various forms and modifications in which the invention might be embodied, the invention being measured by the appended claims and not by the details of the specification.

PREFERRED EMBODIMENTS FOR CARRYING OUT THE INVENTION

Figure 1:
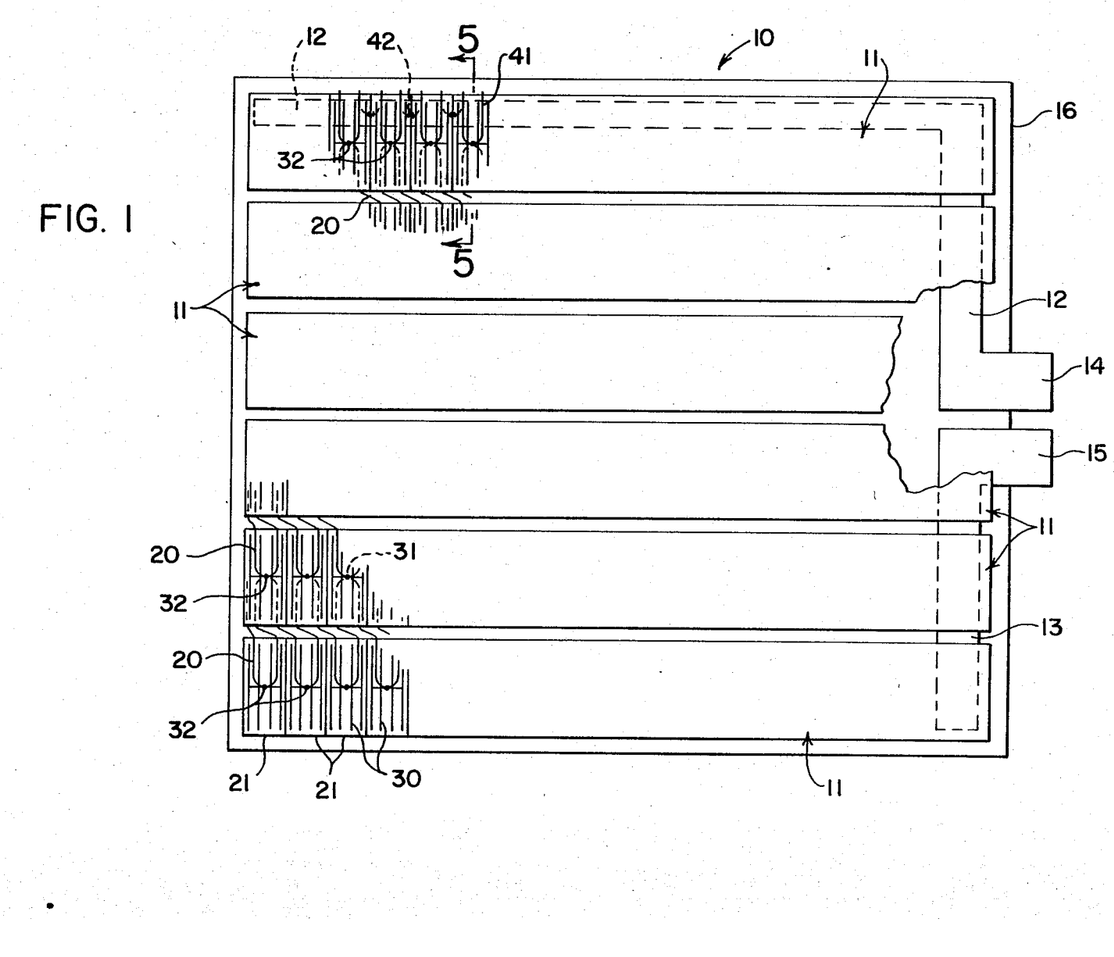
FIG. 1 is a plan view of a photovoltaic cell module embodying the concept of the present invention.

A photovoltaic cell module according to the concept of the present invention is indicated generally by the numeral 10 in FIG. 1 of the accompanying drawings. The photovoltaic module 10 includes a plurality of photovoltaic cell strips 11 electrically joined together in series so as to generate the desired electrical voltage and current output. A first busbar 12 and a second busbar 13 collect the electrical energy from the photovoltaic strips 11 and carry the same to output terminals 4 and 15, respectively, which define the positive and negative terminals of the photovoltaic module 10.

A suitable support member 16 provides physical support for the individual photovoltaic strips 11 as well as the busbars 12 and 13 so as to define a workable assembly. While the support member 16 may be a rigid framework, ideally suited for crystalline silicon solar cells, it may also be in the form of a flexible laminated film which enhances the flexible characteristics of amorphous silicon solar cells. Likewise, a transparent glass or plastic protective covering for the module 10 may be employed to offer protection against impact to the face of the strips 11. Furthermore, by enveloping the module in a protective covering such as plastic, corrosion protection is imparted to the maximum surface area that would otherwise be exposed. In this respect, TEDLAR ® film developed by duPont Company has been found to offer appropriate protection for the module 10 while remaining substantially transparent to solar energy.

Figure 2:
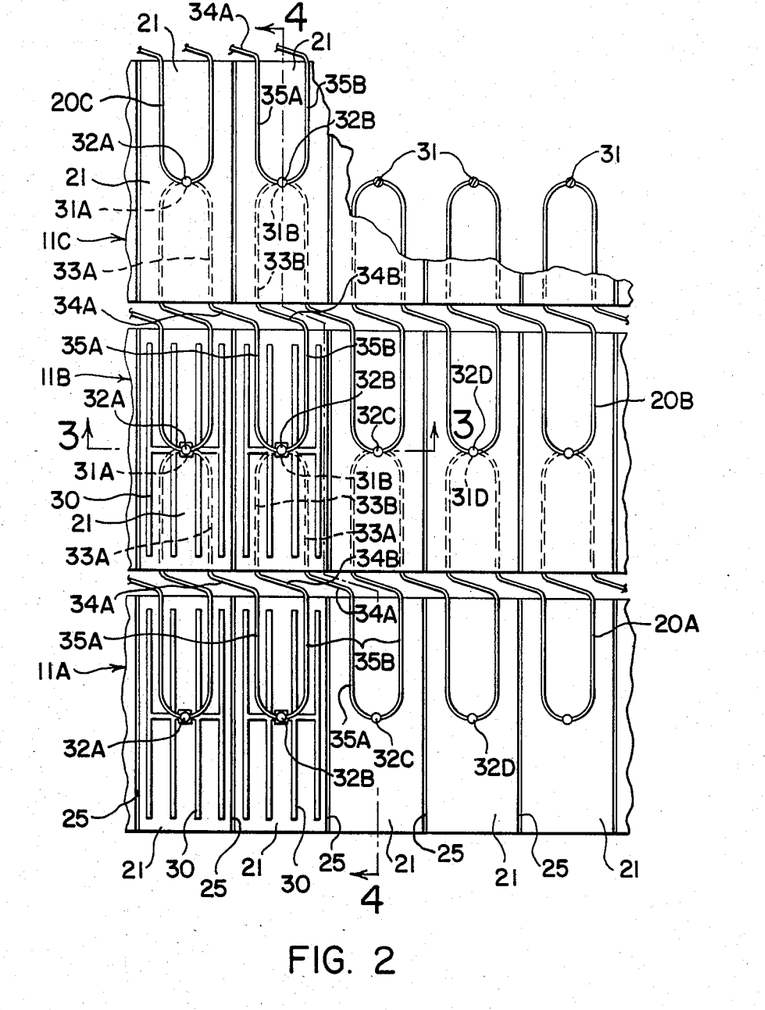
FIG. 2 is an enlarged fragmentary plan view of the photovoltaic cells and electrical interconnections, as employed by the photovoltaic cell module depicted in FIG. 1.

The individual photovoltaic strips 11 and the electrical interconnections between them may be more fully considered by referring to FIG. 2. Particularly, the photovoltaic strips 11 are shown as being electrically joined in series by electrically conductive filaments 20, each extending continuously and repetitively between two adjacent photovoltaic strips 11, as will be discussed more fully hereinbelow. The photovoltaic strips 11, themselves, are composed of a plurality of electrically discrete photovoltaic cells 21, each being adapted to be electrically joined in parallel with the other photovoltaic cells 21 in the same photovoltaic strip 11.

Figure 3:
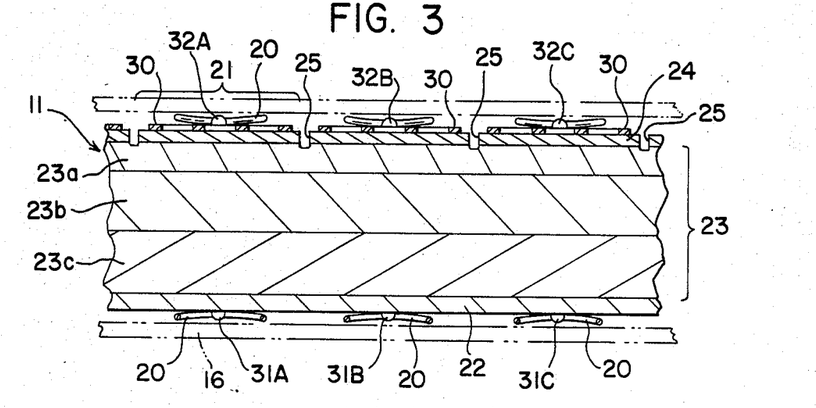
FIG. 3 is an enlarged fragmentary cross-section of a photovoltaic cell strip taken substantially along line 3—3 of FIG. 2.

The structure of the photovoltaic strips 11, and the individual cells 21 of which each is comprised, is shown in FIG. 3. The exemplary strip 11 shown is of the general configuration for an amorphous silicon solar cell, and includes an electrically conductive continuous substrate layer 22, which preferably is a flexible metallic member such as stainless steel. A semiconductor body 23 is deposited on the substrate layer 22 in electrical contact therewith. The semiconductor body 23 includes an N-type layer 23a, an intrinsic layer 23b, and a P-type layer 23c, as normally found in solar cells of the amorphous silicon type. It should be noted that FIG. 3 is not prepared to scale but rather is substantially distorted to show the details of the semiconductor body 23, which is typically less than one micron thick, as compared to the substrate layer 22, which is generally 200 to 300 microns thick.

A transparent, electrically conductive layer 24 is deposited on the semiconductor body 23 so as to form an electrical junction with the N-type layer 23a. The transparent layer 24 is preferably a thin layer of a transparent conductive oxide, such as indium tin oxide (ITO). The individual electrically discrete photovoltaic cells 21 are defined by sectioning the transparent layer 24 into individual pads using transverse cuts 25 extending fully therethrough. It should be noted that sectioning of transparent layer 24 is not a necessity for the practice of the subject disclosure. Indeed, photovoltaic strips 11 will perform satisfactorily when transparent layer 24 is continuous and unsectioned. The sectioning of transparent layer 24, however, provides greater control of the electrical output from the module 10 by selectively introducing individual cells 21 into the electrical circuit.

Depending upon the surface area of the cells 21 and the electrical resistivity of transparent layer 24, it would generally be advantageous to employ electrically conductive grids 30 to collect the electrical energy generated. Particularly, as the surface area of the cell 21 increases, greater electrical resistance in transparent layer 24 hinders the electrical output therefrom as the current is caused to travel along a greater length of resistive medium. Grid 30, on the other hand, is generally a highly electrically conductive material, such as silver, which draws the electrical energy from transparent layer 24 and provides a path of low electrical resistance, thereby reducing power losses.

Electrical grids 30 may be a silver ink which is screen printed onto transparent layer 24 to form relatively thin conductor paths. Such screen printing assures a good electrical junction to be formed between grid 30 and transparent layer 24. Furthermore, because the silver ink is nontransparent, screen printing deposits grid 30 with line widths of approximately 10 mils, thereby limiting optical obscuration losses due to shadowing by grid 30.

The individual cells 21, as well as successive strips 11, are electrically interconnected by filaments 20, as indicated above. With more specificity, and referring to FIGS. 2 and 4, the electrical interconnections embodied in the instant disclosure can be considered.

Figure 4:
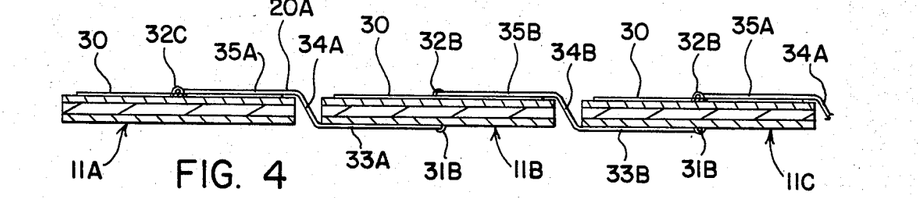
FIG. 4 is a fragmentary lateral cross-section of the photovoltaic cell module taken along line 4—4 of FIG. 2.

Preferably, each filament 20 is very thin conductive wire, such as copper wire having a diameter of approximately 3.1 mils or less. Such material has been found to provide acceptable current carrying capabilities with minimum shadowing of the cells 21 and, also, with desirable flexural properties. Indeed, the flexural properties of filaments 20 are further enhanced by the unique disposition thereof relative to the individual strips 11.

Referring to FIG. 2, as it depicts a series connection between successive strips 11, the specific disposition of filaments 20 is disclosed whereby points 32 on grid 30 of one strip 11 are joined to points 31 on substrate layer 22 of the next adjacent strip 11. Inasmuch as the configuration of filaments 20 defines a repetitive pattern, it need only be necessary to describe this unique configuration through one complete repetition of the pattern of filament 20A, as it progresses from a point of contact 31A on the substrate layer 22 of one strip 11B to a point of contact 32B on grid 30 of the next adjacent strip 11A to a successive point of contact 31B again on the substrate layer 22 of the first strip 11B. The alpha-numeric designations are used herein in an effort to provide a clear description of the disclosure by showing the correlation of successive points of contact on the same strip as well as on adjacent strips.

With respect to the exemplary repetition of the pattern of filaments 20A, contact point 31A defines a spot welded junction, or similar electrical junction such as solder or electrically conductive epoxy, of filament 20A to substrate layer 22 proximate the mid-line of strip 11B. Filament 20A extends laterally through a generous loop 33A to the lower edge of strip 11B whereat skew leg 34A extends upwardly to the upper surface of the next sequenced cell 21 on the next adjacent strip 11A. Filament 20A then extends laterally through a generous loop 35A to a contact point 32B proximate the midpoint of grid 30. Again, while contact point 32B preferably is attached with conductive epoxy to grid 30 thereby forming an electrical connection therewith, other electrical junctions are likewise contemplated, such as soldered or welded connections. Filament 20A returns through loop 35B, essentially a mirror image of loop 35A, to the edge of strip 11A. Skew leg 34B extends downwardly, parallel to leg 34A, to substrate surface 22 of strip 11B. Filament 20A then completes the exemplary repetition through loop 33B, which is virtually a mirror image of loop 33A, and again forms an electrical connection with substrate layer 22 through contact point 31B.

It should be noted here that the foregoing exemplary repetition continues throughout the full length of each of the strips 11 joining successive cells 21 of one strip 11 sequentially with substrate layer 22 of the next adjacent strip 11. Furthermore, it should be recognized that while a contact point 31 on the substrate layer 22 is shown to lie vertically below contact point 32 on grid 30 of the same strip 11, such is only an exemplary embodiment of the disclosure. Indeed, in some applications, it may be more desirable to have contact points 31 and 32, repectively, located at other locations on the strip 11. In addition, while the foregoing discussion relates to electrical interconnections in series, as depicted in FIG. 4, the same principle regarding the orientation, disposition and contact point electrical junction likewise apply to parallel interconnections, among others.

While the drawings depict the foregoing top to bottom interconnection of filament 20, it should be appreciated that the electrical connections of filament 20 with substrate layer 22 may, likewise, be effected by tunneling through the transparent layer 24 and semiconductor body 23, thereby exposing substrate layer 22. Such an arrangement is, indeed, desirable from a production standpoint because the individual strips 11 need not be subjected to the step of inverting the same to effect contact point 31. Rather, as the strips 11 advance through the production process, filament 20 is selectively electrically connected to the substrate layer 22 and transparent layer 24, respectively, of adjacent strips 11 from the front side thereof.

Figure 5:
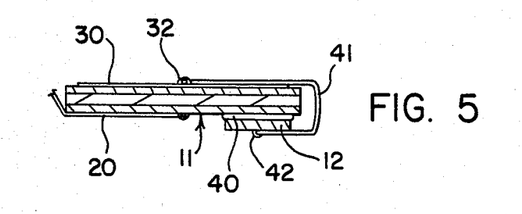
FIG. 5 is a fragmentary lateral cross-section taken substantially along line 5—5 of FIG. 1, and depicting the end photovoltaic cell strip in greater detail.

FIG. 5 depicts the electrical connection between the final strip 11 of the series array with the first busbar 12. The overall characteristics of this interconnection are identical to the interconnection between successive strips 11. The only difference is that a busbar 12 replaces the next adjacent strip in the series and is doubled back under, and secured to, the final strip 11. Particularly, busbar 12 is secured to substrate layer 22 of strip 11 with an insulating adhesive 40 so as to avoid any electrical short circuits therebetween. An electrical filament 41 extends repetitively between the contact points 32 on the upper surface of strip 11 and contact points 42 on busbar 12, as shown in FIG. 1. While filament 41 may be identical to filament 20, it may also be of a heavier gauge wire. This will permit greater current carrying capacity by filament 41 and, because busbar 12 does not move relative to strip 11, it will not impose any detrimental stress to the contact points on to the strip 11 itself.

The mechanical advantages of the disclosed embodiment are found in the remarkable flexibility thereof. Particularly, the thin conductive filaments 20 offers very little resistance to movement of successive strips 11 relative to each other. This is extremely desirable when amorphous silicon solar cells are employed as it enhances the overall flexibility of the module 10. Also, thermal expansion and contraction of the module 10, as well as the individual strips 11, does not cause detrimental stresses to be experienced by the filament 20 or the contact points, 31 and 32, respectively. Furthermore, the general serpentine configuration of filament 20, secured to the respective strips 11 at the distal contact points, 31 and 32, respectively, provides ample material to dissipate any stress to which filament 20 may be exposed. As such, it must be appreciated that the subject disclosure provides electrical interconnections which are highly resistant to fatigue stresses as well as stresses caused from mechanical deformation.

The electrical advantages of the instant disclosure are embodied in the overall system efficiency and reliability. The improved efficiencies are attained primarily through the use of filaments 20. Specifically, the use of copper, or material having similar electrical properties, substantially reduces losses due to electrical resistance. These reductions are further enhanced by forming an electrical junction proximate the mid-point of strips 11 as this assures that a path of minimum electrical resistivity exists uniformly for the entire surface area of each individual cell 21. In addition, because of the high electrical conductivity of filaments 20, a substantially small wire diameter is capable of carrying the electrical energy output. Such small diameter wire reduces optical obscuration losses normally experienced from shadowing effects of the interconnections.

The use of such small diameter wire is also beneficial in avoiding total module failure in the event a short should occur in a sector of a cell strip 11. Principally, under normal operating conditions, the current flow through any segment of wire is approximately 30 to 50 miliamperes. Such current flow is achieved with minimal resistance through the wire. However, should a short develop in one sector of a cell strip 11, the current flow in the immediate vicinity of the short may well approach 5 amperes. The fine wire precludes such a large current flow and thus substantially isolates the remainder of the cells in the module from the detrimental effects of the short.

The reliability of the disclosed interconnections is a result not only of the short isolating characteristics of the filaments 20, but also the redundancy of the filaments 20 relative to contact point 32. As such, two distinct interconnections join each grid 30 of one strip 11 with the substrate layer 22 of the next adjacent strip 11. Therefore, should one of the interconnections experience a structural failure, the second interconnection will satisfactorily carry the electrical energy produced by the cell 21, thereby maintaining the same in a productive capacity in the module 10. Furthermore, should both interconnections from a particular cell 21 experience structural failure, the module 10 will not experience substantial power loss as normally associated with series interconnections, but rather only the power output from that particular cell 21 will be lost. The electrical energy from the other cells 21 in series therewith will be conducted through parallel interconnections established by the continuous substrate layer 22 of the strips 11. As such, those cells preceding and those subsequent to the affected cell in the electrical series will remain in productive capacity in the module.

Production advantages of the disclosed module are two-fold. First, with respect to the use of filaments 20, it is economically more feasible to provide automated systems to locate and secure the filaments 20 to the cell strips 11. Moreover, prior to such operations, the cell strips 11, and particularly the individual cells 21, can be tested for shorts by known techniques, such as infrared photography, and those portions of the cell strip 11, or individual cells 21, can be isolated from the electrical system. This could be accomplished by depositing an insulating material over that region where filament 20 would otherwise contact.

The advantages of the disclosed photovoltaic module 10 may be better appreciated by considering an exemplary model incorporating the teachings herein. In particular, reference is made to a module 10 incorporating amorphous silicon solar cells and having a total power output of 57 watts and a nominal voltage of 12 volts, direct current (D.C.).

The individual strips 11 are approximately 5 centimeters (1.97 inches) wide by 120 centimeters (47.24 inches) long and are evenly divided into 60 cells 21 measuring approximately 5 centimeters (1.97 inches) by 2 centimeters (0.78 inches). Each cell 21 produces approximately 1.2 volts, D.C., and 0.066 amperes of current when exposed to sunlight, under AM-1 conditions. Thus, with the parallel interrelation of the cells 21 in strip 11, the output of each strip 11 is approximately 1.2 volts, D.C., and 3.96 amperes of current.

Using the above disclosed electrical interconnections, a total of twelve strips 11 were electrically joined together in series to form the module 10. As would be appreciated by one knowledgeable in electrical circuits, such a series interconnection permits an aggregation of the voltage output from each strip 11 while maintaining a constant amperage. As such, the electrical output of the module 10 is approximately 14.4 volts, D.C., and 3.96 amperes; and, thus a power output of approximately 57 watts is attainable.

The operation of the foregoing module 10 is exemplary of the instant disclosure. Electrical power generated by each cell 21, as a result of its exposure to an activating light source, is collected from the transparent layer 24 by grid 30 and directed to the mid-point thereof. This electrical energy is received by filament 20 through the electrical junction formed with grid 30 at contact point 32 and transferred thereby to substrate layer 22 of the next adjacent strip 11 through the electrical junction formed at contact point 31. This electrical energy is conducted through the cells 21 of this next adjacent strip 11 and combined with the electrical output therefrom. This process continues throughout the entire module 10 until the final strip 11 transfers the accumulated electrical energy to first busbar 12 via filament 41. Busbar 12 carries the electrical output to output terminal 14 where a voltage differential with output terminal 15 is defined. This is so because terminal 15 is electrically connected with substrate layer 22 of the first in the series of strips 11 via second busbar 11.

The foregoing module 10 has been found to exhibit superb flexibility and resistance to stresses. Furthermore, when combined with a flexible backing material and a transparent protective overlayer, the foregoing module 10 permitted ease of handling during installation and was capable of assuming the contour of a variety of support structures with no detrimental effect. Indeed, the module 10 so embodied was able to be rolled up for ease of transportation and then unfurled for installation. In addition, the foregoing module 10 exhibited remarkable reliability wherein after several handling and installation sequences as well as numerous termperature cyclings, no failure of any cell or electrical interconnection were experienced; and, the module 10 continued generating the full output of electrical power.

Figure 6:
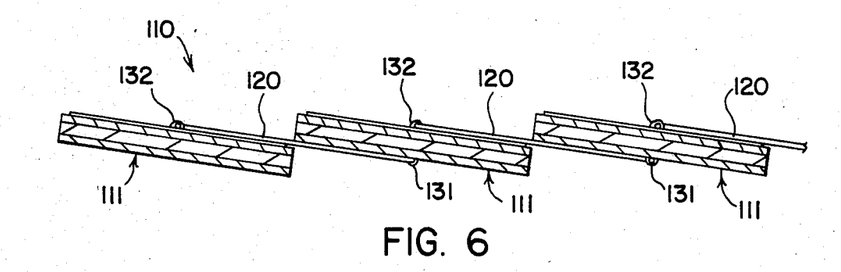
FIG. 6 is a fragmentary lateral cross-section of an alternative embodiment of a photovoltaic cell module embodying the concept of the present invention.

The foregoing advantages and characteristics of a photovoltaic module 10 of the preferred embodiments are likewise associated with an alternative embodiment depicted in FIG. 6. The module 110 of FIG. 6 is identical to module 10 in function and utility. The only difference associated with module 110 is the orientation of the strips 111 relative to one another.

In module 10, successive strips 11 were laterally spaced apart by approximately 1 millimeter (0.04 inches) so as to allow filaments 20 to pass therebetween as the strips 11 were joined electrically in series. In the alternative embodiment disclosed, strips 111 are partially overlapped in a shingle-like arrangement such that no lateral spacing is required. Filaments 120 still assume the repetitive configuration from contact points 132 on the grid of one strip 111 to contact points 131 on the substrate layer of next adjacent strips 111.

As such, a more compact configuration of module 110 is attainable in the alternative embodiment. Furthermore, less complicated filaments 120 are required as there is no need for it to define bends and curves in three dimensions, as was the case with filament 20 in module 10. Moreover, the advantageous characteristics of flexibility, stress resistance, and system reliability are equally encompassed in module 110 as they were in module 10.

While the foregoing discussion has been primarily directed to photovoltaic modules employing a plurality of cell strips, each with a plurality of photovoltaic cells having silver ink grids, all electrically interconnected with fine wire filaments, these are but exemplary embodiments. Recognizable modifications of these embodiments are likewise contemplated within the scope of this disclosure. Particularly, as set forth in FIGS. 7A through 7D, inclusive, alternative wire interconnects are contemplated.

Figure 7A:
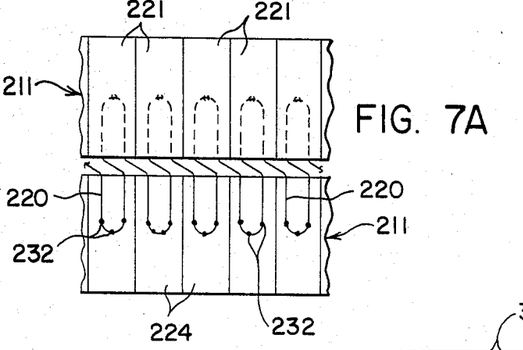
FIGS. 7A through 7D, inclusive, are fragmentary plan views of alternative embodiments of photovoltaic cell modules embodying the concept of the present invention.

FIG. 7A depicts the use of cell strips 211 having individual photovoltaic cells 221. Filament 220 is electrically connected to transparent layer 224 at a plurality of contact points 232. As such, the need for an electrically conductive grid is obviated.

Figure 7B:
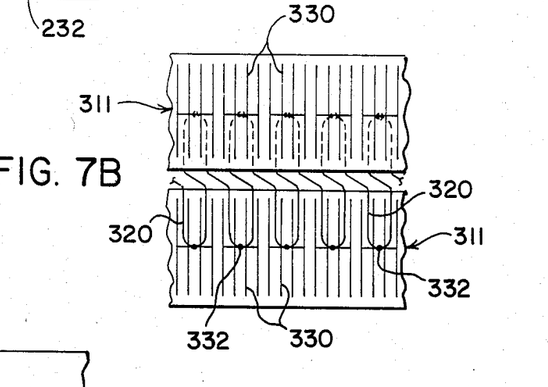

FIG. 7B illustrates cell strips 311 which do not incorporate individual photovoltaic cells. Electrically conductive grids 330, however, are employed to which filament 320 is electrically connected at contact points 332.

Figure 7C:
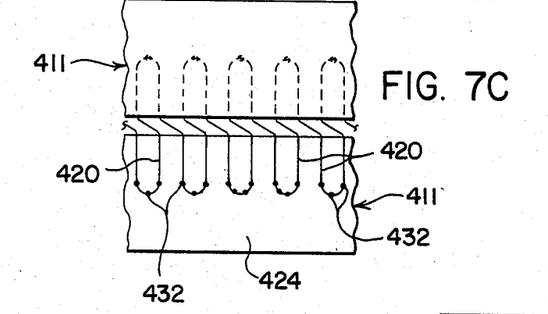

FIG. 7C similarly depicts cell strips 411 which do not incorporate individual photovoltaic cells, nor electrically conductive grids. Rather, filament 420 is electrically connected to transparent layer 424 at a plurality of contact points 432 with each pass thereover.

Figure 7D:
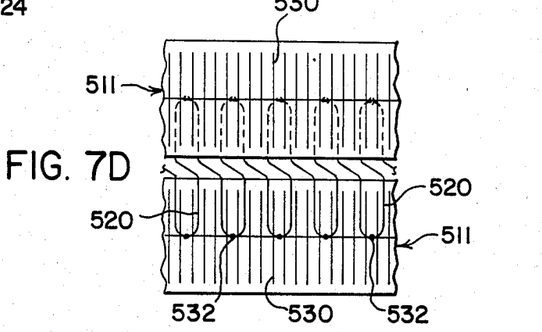

FIG. 7D is directed to cell strips 511 which employ a single conductive grid 530 extending substantially over the entire length thereof. No individual photovoltaic cells are employed. Filament 520 is electrically connected to grid 530 at a plurality of contact points 532, one for each pass of filament 520 over grid 530.

In addition to the foregoing, which show electrical interconnections of cell strips positioned parallel to each other, it must be recognized that other orientations of the cell strips are contemplated. Particularly, the electrical interconnections depicted in FIGS. 7A through 7D, inclusive, are equally applicable to the shingle configuration illustrated in FIG. 6, with the same advantages thereof.

Finally, while the instant disclosure teaches a new and novel module 10 which may be usable by itself for electrical power generation, it should be recognized that such a module 10 may be incorporated into a solar array assembly for achieving greater power output. Furthermore, because of the inherent flexibility of amorphous silicon cell when incorporated into the disclosed module 10, and accordingly the flexibility of module 10, itself, such flexibility will, likewise, be incorporated into an array assembly.

Figure 8:
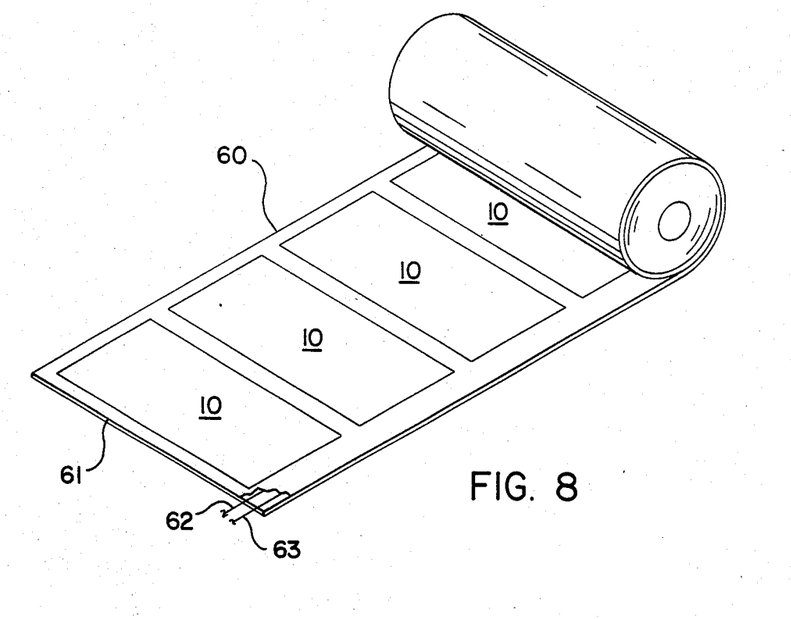
FIG. 8 is a perspective view of a photovoltaic array roll incorporating photovoltaic cell modules embodying the concept of the present invention.

FIG. 8 depicts a flexible array roll 60 incorporating modules of the type disclosed herein. Array roll 60 includes a flexible laminated membrane 61 into which is encapsulated a plurality of modules 10 and electrical conductors 62 and 63. The module 10 may be pre-wired together, selective in series and/or parallel, to achieve the desired electrical voltage and amperage output prior to encapsulation in laminated membrane 61. Thereafter, one needs only to expose a segment of electrical conductors, 62 and 63, to make electrical connection therewith to receive the power generated by array roll 60.

The advantage of such an assembly are indeed appreciative in that the array roll 60 can be rolled or fanfolded for transport to an installation site where workers can then unroll the same for installation. Moreover, the array roll 60 may be sectioned after the lamination process to further tailor the electrical output to the user's needs. That is, array roll 60 may be cut between any two modules 10 thereby achieving smaller array assemblies which, themselves, could be electrically interconnected as would be appreciated by one skilled in the art.

Thus, in view of the foregoing disclosure, it should be evident that a photovoltaic module embodying the concept of the invention disclosed herein provides desirable flexibility throughout the entire assembly. Furthermore, the disclosed invention exhibits substantial resistance to stresses caused by mechanical loading and temperature variations and, therefore, provides a more reliable assembly. Also, manufacture of the disclosed invention is simplified because the continuous wire filament is more easily incorporated into the assembly than was previously possible with individual electrical interconnections. As such, the foregoing invention should be recognized as constituting a new, novel and advantageous contribution to the art.

We claim:
1. A photovoltaic module comprising:
   busbar means;
   a plurality of individual photovoltaic cell strips, each said cell strip having an electrically conductive substrate layer, a semiconductor body deposited on said substrate layer, and a transparent electrically conductive layer deposited on said semiconductor body, said transparent electrically conductive layer being selectively sectioned to define a plurality of electrically distinct photovoltaic cells carried by said cell strip;
   grid means deposited on said transparent electrically conductive layer of each said photovoltaic cell;
   continuous electrically conductive filament means alternately and repetitively connected, at contact points, to said electrically conductive substrate layer of one said photovoltaic cell strip and to said grid means of another said photovoltaic cell strip, wherein said filament means is connected medially of the lateral edges of said respective cell strips; and
   means for connecting said transparent electrically conductive layer of one said photovoltaic cell strip to said busbar means.

2. A photovoltaic module according to claim 1, wherein said filament means includes a first stress relief region proximate to a said contact point on one said cell strip, a second stress relief region proximate to a said contact point on a next adjacent said cell strip, and a third stress relief region interposed between said first and second stress relief regions.

3. A photovoltaic module according to claim 1, wherein said filament means is thin continuous copper wire.

4. A photovoltaic module according to claim 1, wherein said photovoltaic cell strips are laterally spaced relative to each other.

5. A photovoltaic module according to claim 1, wherein said photovoltaic cell strips partially overlap each other in a shingle-like arrangement.

6. A photovoltaic module according to claim 1, further comprising support member means to physically position said photovoltaic cell strips relative to each other.

7. A photovoltaic module comprising:
   busbar means;
   a plurality of individual photovoltaic cell strips, each said cell strip having an electrically conductive substrate layer, a semiconductor body deposited on said substrate layer, and a transparent electrically conductive layer deposited on said semiconductor body;
   continuous electrically conductive filament means alternately and repetitively connected, at contact points, to said electrically conductive substrate layer of one said photovoltaic cell strip and to said transparent electrically conductive layer of another said photovoltaic cell strip, wherein said filament means is connected medially of the lateral edges of said respective cell strips; and
   means for connecting said transparent electrically conductive layer of one said photovoltaic cell strip to said busbar means.

8. A photovoltaic module according to claim 7, wherein said filament means includes a first stress relief region proximate to a said contact point on one said cell strip, a second stress relief region proximate to a said contact point on a next adjacent said cell strip, and a third stress relief region interposed between said first and second stress relief regions.

9. A photovoltaic module accrding to claim 7, further comprising grid means deposited on said transparent electrically conductive layer.

10. A photovoltaic module according to claim 9, wherein said filament means is connected proximate the midpoint of said grid means.

11. A photovoltaic module according to claim 7, wherein said filament means is thin continuous copper wire.

12. A photovoltaic module according to claim 7, wherein said photovoltaic cell strips are laterally spaced relative to each other.

13. A photovoltaic module according to claim 7, wherein said photovoltaic cell strips partially overlap each other in a shingle-like arrangement.

14. A photovoltaic module according to claim 7, wherein said transparent electrically conductive layer is selectively sectioned to define a plurality of electrically distinct photovoltaic cells carried by said cell strip.

15. A photovoltaic module according to claim 14, wherein said filament means is connected to said transparent electrically conductive layer of each said photovoltaic cell.

16. A photovoltaic module according to claim 14, further comprising grid means deposited on said transparent electrically conductive layer of each said photovoltaic cell.

17. A photovoltaic module according to claim 16, wherein said filament means is connected proximate the midpoint of each said grid means.

18. A photovoltaic module comprising: busbar means;
   a plurality of individual photovoltaic cell strips, each said strip having an electrically conductive substrate layer, a semiconductor body deposited on said substrate layer and a discontinuous transparent electrically conductive layer deposited on said semiconductor body wherein each said cell strip is divided into a plurality of electrically distinct photovoltaic cells;
   continuous electrically conductive filament means alternately and repetitively connected, at contact points, to said electrically conductive substrate of one said photovoltaic cell strip and to said transparent conductive layer of another said photovoltaic cell strip, wherein said filament means includes a first stress relief region proximate to a said contact point on one said cell strip, a second stress relief region proximate to a said contact point on a next adjacent said cell strip, and a third stess relief region interposed between said first and second stress relief regions; and
   means for connecting said transparent electrically conductive layer of at least one photovoltaic cell to said busbar means.

19. A photovoltaic module according to claim 18, wherein said filament means is connected to said transparent electrically conductive layer of each said photovoltaic cell at a plurality of points.

20. A photovoltaic module according to claim 18, further comprising grid means deposited on said transparent electrically conductive layer of each said photovoltaic cell.

21. A photovoltaic module according to claim 20, wherein said filament means is connected proximate the midpoint of each said grid means.

22. A photovoltaic module according to claim 18, wherein said filament means is thin continuous copper wire.

23. A photovoltaic module according to claim 18, wherein said cell strips are laterally spaced relative to each other.

24. A photovoltaic module according to claim 18, wherein said cell strips partially overlap each other in a shingle-like arrangement.

25. A photovoltaic module comprising:

a plurality of individual photovoltaic cell strips, each said cell strip having an electrically conductive substrate layer, a semiconductor body deposited on said substrate layer, and a transparent electrically conductive layer deposited on said semiconductor body;

continuous electrically conductive filament means alternately and repetitively connected to said electrically conductive substrate layer of one said photovoltaic cell strip and to said transparent electrically conductive layer of another said photovoltaic cell strip, said filament means making contact with said layers at a plurality of contact points and having a first stress relief region proximate to a said contact point on one said cell strip, a second stress relief region proximate to a said contact point on a next adjacent cell strip, and a third stress relief region angularly interposed between said first and second regions; and means for receiving electrical energy from said transparent electrically conductive layer of one said photovoltaic cell strip.

26. A flexible photovoltaic array roll comprising:

a plurality of longitudinally spaced flexible photovoltaic modules, wherein said photovoltaic modules comprise busbar means, a plurality of individual photovoltaic cell strips, each said cell strip having an electrically conductive substrate layer, a semiconductor body deposited on said substrate layer, and a transparent electrically conductive layer deposited on said semiconductor body, said transparent electrically conductive layer being selectively sectioned to define a plurality of electrically distinct photovoltaic cells carried by said cell strip, grid means deposited on said transparent electrically conductive layer of said photovoltaic cell, continuous electrically conductive filament means alternately and repetitively connected, at contact points, to said electrically conductive substrate layer of one said photovoltaic cell strip and to said grid means of another said photovoltaic cell strip, said filament means including a first stress relief region proximate to a said contact point on one said cell strip, a second stress relief region proximate to a said contact point on a next adjacent said cell strip, and a third stress relief region interposed between said second and third stress relief regions and, means for connecting said transparent electrically conductive layer of one said photovoltaic cell strip to said busbar means;

means for receiving electrical energy from said modules; and means which encapsulate said modules and said means for receiving.

* * * * *